(12) United States Patent
Arndt et al.

(10) Patent No.: US 7,265,535 B2
(45) Date of Patent: Sep. 4, 2007

(54) CIRCUIT CONFIGURATION FOR PROVIDING OF A DIAGNOSTIC SIGNAL FOR A POWER SWITCHING DEVICE

(75) Inventors: Bastian Arndt, Eilsbrunn (DE); Ralf Förster, Regensburg (DE); Konstantin Thiveos, Murnau (DE); Gunther Wolfarth, Neutraubling (DE)

(73) Assignee: Siemens Aktiengesellschaft, Munich (DE)

( * ) Notice: Subject to any disclaimer, the term of this patent is extended or adjusted under 35 U.S.C. 154(b) by 104 days.

(21) Appl. No.: 11/271,200

(22) Filed: Nov. 10, 2005

(65) Prior Publication Data

US 2006/0129889 A1   Jun. 15, 2006

(30) Foreign Application Priority Data

Nov. 10, 2004   (DE) ...................... 10 2004 054 374

(51) Int. Cl.
*G01R 31/28* (2006.01)
(52) U.S. Cl. .................................. 324/158.1
(58) Field of Classification Search ............... 324/765, 324/158.1, 415–424, 769, 763; 200/50.28; 714/34; 326/89, 63, 68, 81; 327/424, 410, 327/391
See application file for complete search history.

(56) References Cited

U.S. PATENT DOCUMENTS 6,501,300 B2 * 12/2002 Hatae .......................... 326/93
6,861,835 B2 * 3/2005 Maly et al. .............. 324/140 R
7,208,955 B2 * 4/2007 Zansky et al. .............. 324/418

FOREIGN PATENT DOCUMENTS

EP   0 708 529 A2   4/1996

* cited by examiner

*Primary Examiner*—Ha Tran Nguyen
*Assistant Examiner*—Tung X. Nguyen
(74) *Attorney, Agent, or Firm*—Laurence A. Greenberg; Werner H. Stemer; Ralph E. Locher

(57) ABSTRACT

A circuit configuration providing a diagnostic signal for a power switching device which switches a load has a test circuit, a filter device, a validation device, and a coding device. The test circuit tests the power switching device and generates error symptoms for characterizing error types of different priorities. The filter device, depending on an activation signal activating the power switching device, provides a validity signal for the generated error symptoms. The validity signal specifies the validity of the corresponding error symptom in each case. The validation device validates a generated error symptom depending on the associated validity signal in each case and validates the validated activation signal and from this generates a group of is states and the associated complementary states. The coding device codes the states and complementary states depending on the priorities of the error types assigned to the states and complementary states. The diagnostic signal is formed from the coded states and complementary states.

13 Claims, 4 Drawing Sheets

| Error Symptom (Hardware) | Error Type (Software) | |
|---|---|---|
| | Low-Side Switch | High-Side Switch |
| Overcurrent (OC) | SCB | SCG |
| Low Voltage Over Transistor (LVT) | SCG | SCB |
| Open Load Voltage (VOL) | OL | OL |

FIG. 1
PRIOR ART

|  | AS=0 | | | AS=1 | | |
|---|---|---|---|---|---|---|
| FS3 | 0 | 0 | 1 | 1 | 0 | U>Vref1>Vref2 => 1 |
| FS2 | 0 | 1 | 1 | 1 | 0 | U>Vref2 => 1 |
| GS2/GS3 | 0 | 0 | 0 | 0 | 0 | 0 = Filter Time Elapsed |
| FS1 | 0 | 0 | 0 | 1 | 0 | I>Iref => 1 |
| GS1 | 0 | 0 | 0 | 0 | 0 | 0 = Filter Time Elapsed |
|  | Z2=1 | Z3=1 | Z5/6=1 | Z1=1 | Z4=1 |  |

|  | DS | | |
|---|---|---|---|
|  | b1 | b2 | b3 |
| Z1 | 0 | 0 | 1 |
| Z2 | 0 | 1 | 0 |
| Z3 | 0 | 1 | 1 |
| Z4&Z5&Z6 | 1 | 0 | 0 |
| Z4 | 1 | 0 | 1 |
| Z5&Z6 | 1 | 1 | 0 |
| No Diagnosis | 1 | 1 | 1 |

↑ Priority

CIRCUIT CONFIGURATION FOR PROVIDING OF A DIAGNOSTIC SIGNAL FOR A POWER SWITCHING DEVICE

BACKGROUND OF THE INVENTION

Field of the Invention

The invention relates to a circuit configuration for provision of a diagnostic signal for a power switching device.

Electronic power switching devices such as half bridges, full bridges, high-side switches, low-side switches or the like are known to be used in many applications for switching loads. They are frequently equipped with diagnostic circuits. Currents can be measured via the diagnostic circuits. The measured currents and voltage are used for hardware detection of error symptoms such as overcurrent (OC) low voltage over transistor (LVT) or open load voltage (VOL). On the basis of the error symptoms detected, a decision is made via the software as to whether a specific error type is present.

In this connection FIG. 1 shows an example of a schematic table for assignment of error symptoms to error types depending on the tested power switching device. If for example a low-side switch is used and tested as the power switching device then the following applies: If the error symptom overcurrent (OC) "is not present in the hardware, a check is made in the software as to whether the error type short circuit to battery (SCB)" was able to be detected. If the error symptom "low voltage over transistor (LVT)" is not present in the hardware, a check is made in the software as to whether the error type "short circuit to ground (SCG)" was able to be detected. If the error symptom "open load voltage(VOL)" is not present in the hardware, a check is made in the software as to whether the error type "open load (OL)" was able to be detected. By contrast, for a high-side switch used and tested as the power switching device, the following applies: If the error symptom "overcurrent (OC)" is not present in the hardware, a check is made in the software as to whether the error type "short circuit to ground (SCG)" was able to be detected. If the error symptom "low voltage over transistor (LVT)" is not present in the hardware, a check is made in the software as to whether the error type "short circuit to battery (SCB)" was able to be detected.

If a particular type of error is present, a counter is incremented in the software for the corresponding error type to ensure debouncing.

If for example with a low-side switch the error symptom "overcurrent" is not present, the software validates whether the error type "short circuit to battery" was able to be detected at all. Thus if the error type "short circuit to battery" is not present for the corresponding filter time, a counter for this error type will be decremented in the software if the error type is also not present for the following filter times or diagnosis times after the validation, the counter for this error type is decremented.

The problem is however that it is not possible to detect whether a specific error type is not present. The initial assumption can thus not be made that a specific error type is not present or the specific error type was not detected. For it is conceivable that a diagnosis was not possible for a specific diagnosis cycle, since the on and off times were too short and thereby the filter times for the filter identification have not completely elapsed. The fact that diagnosis was not possible because of a protection shutdown can also not be excluded. It is also conceivable that a diagnosis was not possible for a power switching device which was permanently switched on or off.

In addition, diagnoses can also be greatly influenced by the properties of the load to be switched. For example an inductive load has major effects on the rise in current at switch-on and for a current measurement thus leads to open load voltage detection by the software used if an inadequately long filter time has been selected, although there is actually no error present here. Known error detection methods do not actually ensure that the fact that an error is not present can be detected. Furthermore for validation in the software the information must always be available as to whether the power switching device was switched on and is currently switched on. Software validation in any event requires very large processing resources. The processing resources needed are thus occupied and are not available for other applications. In addition the software validation creates real-time problems since processing time must be expended for validation of the error symptoms detected by the hardware.

SUMMARY OF THE INVENTION

It is accordingly an object of the invention to provide a circuit configuration for generating a diagnostic signal which overcomes the above-mentioned disadvantages of the heretofore-known devices and methods of this general type and with which both the presence of a specific error type and also the non-presence of specific error types can be specified as reliably as possible.

With the foregoing and other objects in view there is provided, in accordance with the invention, a circuit configuration for providing a diagnostic signal for a diagnosis of a power switching device for switching a load, the circuit configuration comprising:

a test circuit connected to the power switching device and configured to test the power switching device and to generate error symptoms depending on the testing for characterizing error types of different priorities;

a filter device connected to said test circuit, said filter device, depending on an activation signal AS to activate the power switching device, providing a validity signal for the error symptoms in each case, with the validity signal specifying a validity of the corresponding error symptom in each case;

a validation device connected to said test circuit for validating a generated error symptom depending on the associated validity signal in each case and validating a validated activation signal AS, and generating therefrom a group of states and associated complementary states; and a coding device connected to said validation device for coding the states and the complementary states depending on the priorities of the error types assigned to the states and the complementary states, with a diagnostic signal being formed from the coded states and the complementary states.

Advantageously the provision of the states and complementary states ensures that it is possible to uniquely determine whether a specific error type is present or whether the specific error type is not present. This means that the debounce counter contained in the downstream software can be incremented if an error type is present and can be decremented for the non-presence of a specific error type. In addition states and the complementary states represent validated error symptoms. Advantageously a validation in the software is no longer necessary thereafter. This means that only a reduced processing effort is needed in the software. In addition the diagnostic cycles can advantageously be reduced because of the provision of the filter device by the hardware.

In accordance with a further development of the invention, the test circuit is designed to generate the error symptoms "overcurrent," "low voltage over transistor," and/or "open load voltage."

In accordance with a preferred further development the validation device is designed to provide an "overcurrent" state as a first state, a "low voltage over transistor" state as a second state, an "open load voltage" state as a third state, a "no overcurrent" state as a first complementary state, a "no low voltage over transistor" state as a second complementary state and a "no open load voltage" state as a third complementary state.

In accordance with a preferred further development the coding device is embodied as a 3-bit coder which creates from the three states and the three complementary states a priority-dependent 3-bit diagnosis signal with a bit pattern of three bits. Advantageously only three bits are to be transferred for a diagnosis cycle with this method, with the three bits embodying all the combinations of states and complementary states.

In accordance with a further preferred development the 3-bit coder features a device which assigns to the first state the highest priority, to the second state the second-highest priority, to the third state the third-highest priority, to the first complementary state the fourth-highest priority and to the second and third complementary state the lowest priority respectively. Advantageously this always maintains the state or complementary state which has the highest priority.

In accordance with a further preferred embodiment a memory device is provided between the validation device and the encoding device which features at least one memory element for intermediate storage of one state and/or complementary state in each case.

In accordance with a further preferred embodiment the filter device features an adjustable first timer, which provides a first validity signal for the error symptom "overcurrent" and a second timer which provides a second validity signal for the error symptom "low voltage over transistor" and a third validity signal for the error symptom "open load voltage". For example the second validity signal and the third validity signal can correspond to each other. Advantageously only a single validity signal is thus necessary for the error symptom "low voltage over transistor" and for the error symptom "open load voltage".

In accordance with a further preferred development a filter time is provided for each timer, with the corresponding timer then setting the corresponding validity signal as valid when the filter time assigned to the timer has elapsed. Advantageously provision is thus already made in the hardware for validating the corresponding error symptoms by means of their associated validity signals. An error symptom is then validated or valid if the corresponding validity signal is valid, i.e. if the filter time of the corresponding timer has elapsed.

In accordance with a further preferred embodiment the first timer and the second timer each receive the activation signal and the corresponding error symptoms on the input side, with the logical level of the activation signal determining which timer is activated. For example an activation signal set to a positive logical level activates the first timer and an activation signal set to a negative logical level activates the second timer. Advantageously an activation signal set to a positive logical level activates the error symptom, which is detected by means of a current measurement, and an activation signal set to a negative logical level activates the error symptoms which are detected by a voltage measurement.

In accordance with a preferred further development a serial interface device is provided at which the diagnosis signal is present. Advantageously the diagnostic signal is transmitted over the interface device to the control device which evaluates the diagnostic signal as regards the presence of error types and as regards the non-presence of error types.

In accordance with a further preferred development the interface device is embodied such that the filter times of the first timer and of the second timer can be set and/or the reference current can be set and/or the memory elements of the memory device can be reset to a predeterminable state via an external control device which can be connected to the interface device.

In accordance with a further preferred development an OR gate is provided which logically ORs the first state "overcurrent" with the signal at the output of a temperature sensor such that an "overload" state is produced at the output of the OR gate.

Furthermore the power switching device can be embodied as a half bridge, a full bridge, as a low-side switch, or as a high-side switch.

Other features which are considered as characteristic for the invention are set forth in the appended claims.

Although the invention is illustrated and described herein as embodied in a circuit configuration for provision of a diagnostic signal for a power switching device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a schematic table for assignment of error symptoms to error types depending on the tested power switching device in accordance with the prior art;

FIG. 4 is a schematic table for determining the states of the validation device in accordance with the present invention; and FIG. 5 is a schematic table for priority-dependent coding of the states in a diagnostic signal by the coding unit in accordance with the invention.

DESCRIPTION OF THE PREFERRED EMBODIMENTS

Figure 2:
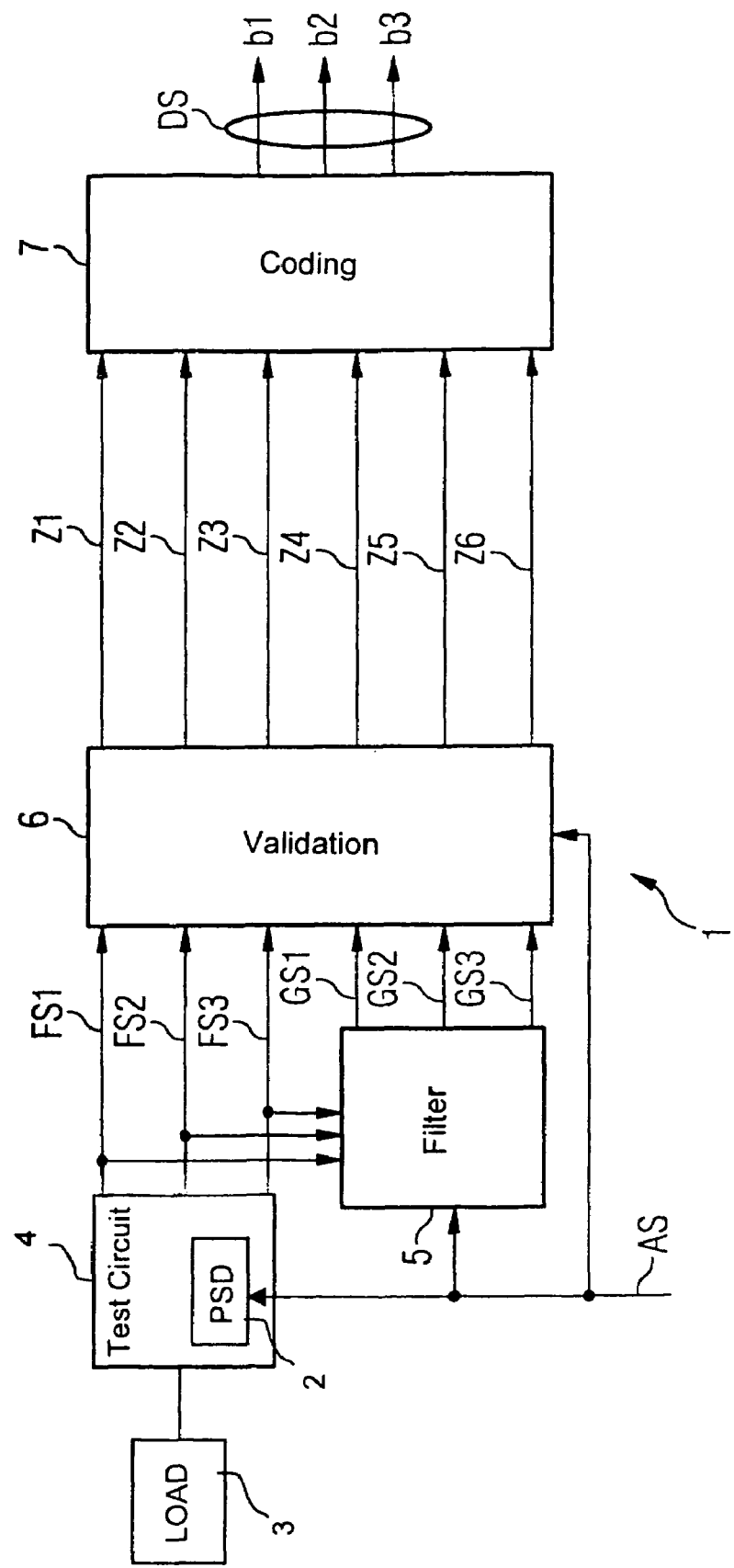
FIG. 2 is a schematic block diagram of a first preferred exemplary embodiment of the circuit configuration according to the invention for provision of a diagnostic signal for a power switching device.

Referring now to the figures of the drawing in detail and, particularly, to FIG. 2 thereof, there is shown a schematic block diagram of a first preferred exemplary embodiment of the circuit configuration 1 according to the invention for provision of a diagnostic signal DS for a power switching device 2.

The inventive circuit configuration 1 features a test circuit 4, which tests the power switching device 2 (PSD), a filter device 5, a validation device 6 and a coding device 7 for providing the diagnostic signal DS.

The test circuit 4, which tests the power switching device 2, which switches a load 3, generates, independently of the testing, error symptoms FS1, FS2, FS3 for characterizing error types of different priorities. Preferably the test circuit 4 generates, as a function of the testing, an error symptom "overcurrent" FS1, an error symptom "low voltage over transistor" FS2, and an error symptom "open load voltage" FS3.

The power switching device 2 is preferably embodied as a half-bridge, as a full-bridge, as a low-side switch, or as a high-side switch.

The filter device 5 of the inventive circuit configuration 1, depending on an activation signal AS for activating the power switching device 2 and on the corresponding error symptoms FS1, FS2, FS3, provides a validity signal GS1, GS2, GS3 for the generated error symptoms FS1, FS2, FS3 in each case, with the validity signal GS1, GS2, GS3 specifying the validity of the corresponding error symptom FS1, FS2, FS3 in each case. An activation signal AS set to appositive logic level preferably means that the power switching device 2 is in a switched-on state, and an activation signal AS set to a negative logical level preferably means that the power switching device 2 is in the switched-off state.

The validation device 6 of the inventive circuit configuration 1 validates a generated error symptom FS1, FS2, FS3 in each case depending on the associated validity signal GS1, GS2, GS3 and the activation signal AS and from this generates a group of states (Z1-Z3) and complementary states (Z4-Z6) to complement them. For example the validation device 6 generates a first state Z1, a second state Z2, a third state Z3, a first complementary state Z4, a second complementary state Z5, and a third complementary state Z6.

For example the validation device 6 validates the error symptom "overcurrent" FS1 depending on the associated validity signal GS1 and the activation signal AS as follows: If the activation signal AS is set to a positive logical level, i.e. the power switching device 2 is in the switched-on state and a current measurement can be performed, and the validity signal GS1 is set to a positive logical level, i.e. a filter time for the error symptom "overcurrent" FS1 has expired (see FIG. 2 and associated description), the state "overcurrent" Z1 is set, if the error symptom "overcurrent" is set to a positive logical level or the complementary state "no overcurrent" Z4 is set if the error symptom "overcurrent" FS1 is set to a negative logical level. The same then applies to the other states Z2, 23 and their complementary states Z5 and Z6.

Preferably the validation device provides an "overcurrent" state 21 as a first state Z1, a "low voltage over transistor" state 22 as a second state 22, an "open load voltage" state 23 as a third state 23, a "no overcurrent" state 24 as a first complementary state Z4, a "no low voltage over transistor n state Z5 as a second complementary state 25, a "no open load voltage" state 26 as a third complementary state Z6.

The coding device 7 of the inventive circuit configuration 1 codes the states Z1-Z3 and complementary states Z4-Z6 depending on the priorities of the error type assigned to the states Z1-Z3 and complementary states Z4-Z6, with the diagnostic signal DS being formed from the coded states Z1 Z3 and complementary states Z4-Z6.

Preferably the coding device 7 is embodied as a 7-bit coder which creates from the three states Z1-Z7 and the three complementary states Z4-26 a priority-dependent 3-bit diagnosis signal DS with a bit pattern b1, b2, b3 of three bits. Preferably the bit pattern b1, b2, b3 of three bits is transmitted for further evaluation to a non-illustrated control device.

Preferably the 3-bit coder 7 features a device which assigns to the first state Z1 the highest priority, the second state Z2 the second-highest priority the third state Z3 the third highest priority, the first complementary state Z4 the fourth-highest priority and the second and third complementary states Z5, Z6 the lowest priority.

Figure 3:
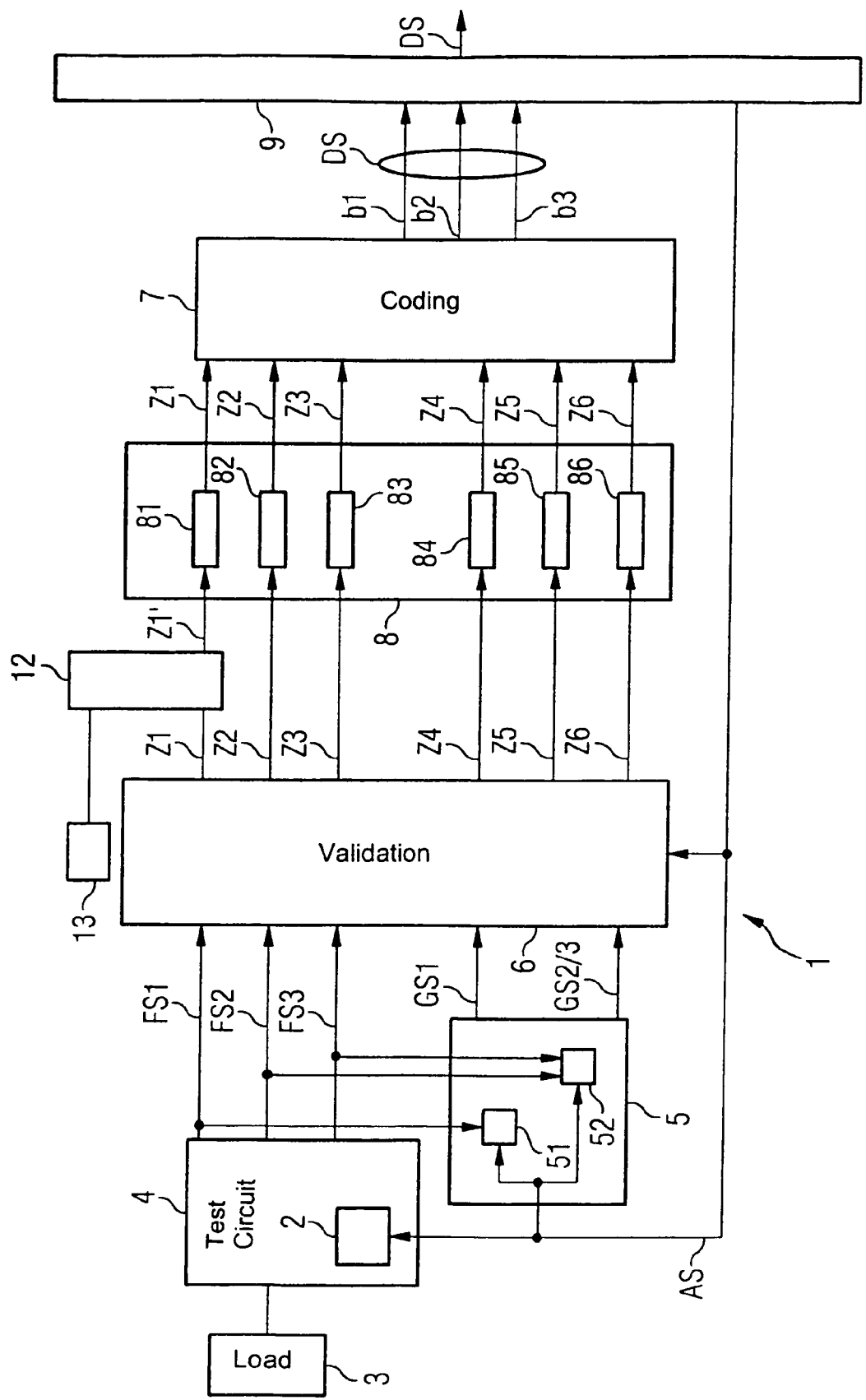
FIG. 3 is a schematic block diagram of a second preferred exemplary embodiment of the inventive circuit configuration for provision of a diagnostic signal for a power switching device.

FIG. 3 shows a schematic block diagram of a second exemplary embodiment of the inventive circuit configuration 1 for providing a diagnostic signal DS for a power switching device 2. The second exemplary embodiment of the inventive circuit configuration 1 in accordance with FIG. 3 is a further development of the first exemplary embodiment of the inventive circuit configuration 1 in accordance with FIG. 2. Accordingly the second exemplary embodiment has all the features of the first exemplary embodiment. The second exemplary embodiment in accordance with FIG. 3 is developed by the following devices or units by comparison with the first exemplary embodiment.

A memory device 8 is connected between the validation device 6 and the coding device 7. The memory device 8 features a memory element 81-86 for intermediate storage of each state Z1-Z3 and complementary state Z4-Z6 respectively.

The filter device 5 preferably features an adjustable first timer 51 and an adjustable second timer 52. The first timer 51 for example provides a first validity signal GS1 for the error symptom "overcurrent" FS1. The second timer S2 provides a second validity signal GS2 for the error symptom "low voltage over transistor" FS2 and a third validity signal GS3 for the error symptom "open load voltage" FS3. Preferably the second validity signal GS2 and the third validity signal GS3 correspond to each other.

Preferably a filter time is provided for each timer 51, 52, with the corresponding timer setting the corresponding validity signal GS1, GS2, GS3 as valid when the filter time assigned to the timer 52 has expired.

The first timer 51 and the second timer 52 preferably receive the activation signal AS in each case and the corresponding error symptoms FS1, FS2, FS3, with the logical level of the activation signal AS defining which timer 51, 52 will be used. For example an activation signal AS set to a positive logical level activates the first timer 51 and an activation signal AS set to a negative logical level activates the second timer 52.

Furthermore a serial interface device 9 is preferably provided at which the diagnostic signal DS is present. For example the interface device 9 provides the diagnostic signal DS of the electronic control device (not shown) connected to the circuit configuration 1.

In particular the interface device 9 is embodied such that the filter times of the first timer 51 and of the second timer 52 can be set and/or the reference currents and reference voltages can be set and the memory elements 81-86 of the memory device 8 can be reset to a predeterminable state via the external control device which can be connected to the interface device 9.

Furthermore an OR gate 13 is preferably provided which logically ORs the first state "overcurrent" Z1 with the digital signal at the output of a temperature sensor 3 such that an "overload" state 21' is produced at the output of the OR gate 13. In particular when a state of "overload" 21' has been set the activation signal AS is set to a negative logical level and the power switching device 2 is switched off.

FIG. 4 shows a schematic table for determination of the states Z1-23 and the complementary states 24-26 by the validation device 6 in accordance with the present invention.

The first, second and the third validity signal GS1, GS2, GS3 are each then set to a negative logical level and is thereby valid if the corresponding filter time for the respective validity signal GS1, GS2, GS3 has elapsed.

The first state Z1 and the first complementary state Z4 are then validated by the validation device 6 if the activation signal AS is set to a positive logical level, i.e. if the power switching device 2 is in the switched-on state. The first state "overcurrent" Z1 is set to a positive logical level if the validity signal GS1 is set to a negative logical level and the error symptom "overcurrent" FS1 is set to a positive logical level. The first complementary state "no overcurrent" is set to a positive logical level if the validity signal GS1 is set to a negative logical level, i.e. the filter time has elapsed and the error symptom "overcurrent" FS1 is set to a negative logical level.

The second and third state 22, 23 as well as their complementary states 25, 26 are validated by the validation device 6 if the activation signal AS is set to a negative logical level, i.e. if the power switching device 2 is in the switched-off state. The state "low voltage over transistor" 22 is set to a positive logical level if the associated validity signal GS2 is set to a negative logical level, i.e. when the filter time has elapsed and if the error symptom FS2 is set to a negative logical level. The complementary state Z2 "no low voltage over transistor" is set it the validity signal GS2 is set to a negative logical level and the error symptom "low voltage over transistor" FS2 is set to a positive logical level.

The "open load voltage" Z3 state is set to a positive logical level if the associated third validity signal GS3 is set to a negative logical level, the error symptom "low voltage over transistor" FS2 is set to a positive logical level and the third error symptom "open load voltage" FS3 is set to a negative logical level.

The complementary state "no open load voltage" 26 is set if the state "open load voltage" Z3 is not set and the third validity signal GS3 is set to a negative logical level.

FIG. 5 shows a schematic table for priority-dependent coding of the states and complementary states in a diagnostic signal DS by the inventive coding unit 7. The coding device 7 codes the states Z1-23 and the complementary states 24-26 depending on priority such that the first state 21 has the highest priority, the second state 22 the second-highest priority, the third state Z3 the third-highest priority, the first complementary state 24 the fourth-highest priority and the second and third complementary states 25, Z6 the lowest priority of the states and complementary states in each case. Below the lowest priority of the states and complementary states the state "no diagnosis" is also provided which also corresponds to the initial state at the start of each diagnostic cycle. Between the third-highest and the fourth-highest priority of the individual states the state "no error present" is provided, which is embodied by an AND logical operation on the first, second and third complementary states Z4, ZS, 26 and specifies that a diagnosis has been undertaken wherein no error type occurred.

Although the present invention has been described in the foregoing with reference to the preferred exemplary embodiment it is not restricted to this embodiment but can be modified in a plurality of ways. For example it is conceivable to use fewer or more error symptoms for diagnosis of error types. Furthermore the type of coding according to FIG. 6 can also be adapted to the relevant application. For example the arrangement of the bits of the bit pattern can simply be reversed.

We claim:

1. A circuit configuration for providing a diagnostic signal for a diagnosis of a power switching device for switching a load, the circuit configuration comprising:
    a test circuit connected to the power switching device and configured to test the power switching device and to generate error symptoms depending on the testing for characterizing error types of different priorities;
    a filter device connected to said test circuit, said filter device, depending on an activation signal AS to activate the power switching device, providing a validity signal for the error symptoms in each case, with the validity signal specifying a validity of the corresponding error symptom in each case;
    a validation device connected to said test circuit for validating a generated error symptom depending on the associated validity signal in each case and validating a validated activation signal AS, and generating therefrom a group of states and associated complementary states; and
    a coding device connected to said validation device for coding the states and the complementary states depending on the priorities of the error types assigned to the states and the complementary states, with a diagnostic signal being formed from the coded states and the complementary states.

2. The circuit configuration according to claim 1, wherein said test circuit is configured to generate at least one error symptom selected from the group of error symptoms consisting of "overcurrent", "low voltage over transistor", and "open load voltage".

3. The circuit configuration according to claim 2, wherein said validation device is configured to provide as a first state an "overcurrent" state, as a second state a "low voltage over transistor" state, as a third state (Z3) an "open load voltage" state, as a first complementary stats a "no overcurrent" state, as a second complementary state a "no low voltage over transistor" state and as a third complementary states a "no open load voltage" state.

4. The circuit configuration according to claim 3, wherein said coding device is a 3-bit coder configured to generate from the three states and the three complementary states a priority-dependent 3-bit diagnostic signal with a bit pattern of three bits.

5. The circuit configuration according to claim 4, wherein said 3-bit coder comprises a device for assigning the first state a highest priority, the second state a second-highest priority, the third state a third-highest priority, the first complementary state a fourth-highest priority, and the second and third complementary states a lowest priority.

6. The circuit configuration according to claim 1, which comprises a memory device connected between said validation device and said coding device, said memory device having at least one memory element for intermediately storing each state and/or complementary state.

7. The circuit configuration according to claim 1, wherein said filter device includes an adjustable first timer providing a first validity signal for the error symptom "overcurrent", and a second timer providing a second validity signal for the error symptom "low voltage over transistor", and a third validity signal for the error symptom "open load voltage".

8. The circuit configuration according to claim 7, wherein a filter time is defined for each timer, and the corresponding said timer sets a corresponding validity signal as being valid if the filter time assigned to the timer has elapsed.

9. The circuit configuration according to claim 7, wherein, said first timer and said second timer each has an input receiving the activation signal AS and the corresponding error symptoms, and a logic level of the activation signal AS defines which of said timers is activated.

10. The circuit configuration according to claim 1, which further comprises a serial interface device connected to said coder, said interface device carrying the diagnostic signal.

11. The circuit configuration according to claim 7, which further comprises a serial interface device connected to said coder, said interface device carrying the diagnostic signal.

12. The circuit configuration according to claim 11, wherein said interface device is configured such that the filter times of said first timer and of said second timer can be set and/or reference currents and reference voltages can be adjusted and/or said memory elements of said memory device can be reset into a predetermined state via an external control device to be connected to said interface device.

13. The circuit configuration according to claim 1, which further comprises an OR gate configured to logically combine the first state "overcurrent" with a digital signal originating from a temperature sensor, said OR gate outputting a signal with a state of "overload".

* * * * *